United States Patent
Yang et al.

(10) Patent No.: US 6,359,313 B1
(45) Date of Patent: Mar. 19, 2002

(54) ELECTROSTATIC DISCHARGE PROTECTION TRANSISTOR FOR A SEMICONDUCTOR CHIP

(75) Inventors: Hyang-Ja Yang, Suwon; Kook-Hwan Kwon, Yongin, both of (KR)

(73) Assignee: Samsung electronics Co., Ltd., Suwon (KR)

( * ) Notice: Subject to any disclaimer, the term of this patent is extended or adjusted under 35 U.S.C. 154(b) by 0 days.

(21) Appl. No.: 09/313,882

(22) Filed: May 18, 1999

(30) Foreign Application Priority Data

May 18, 1998 (KR) ............................................. 98-17780

(51) Int. Cl.⁷ ............................................. H01L 23/62
(52) U.S. Cl. ...................... 257/355; 257/327; 257/328; 257/329; 257/330; 257/346
(58) Field of Search .................. 257/327, 346, 257/355, 330, 328, 329

(56) References Cited

U.S. PATENT DOCUMENTS

| | | | | |
|---|---|---|---|---|
| 5,898,193 A | * | 4/1999 | Ham | 257/173 |
| 5,932,916 A | * | 8/1999 | Jung | 257/355 |
| 5,932,918 A | * | 8/1999 | Krakauer | 257/368 |
| 5,963,409 A | * | 10/1999 | Chang | 361/56 |
| 5,991,134 A | * | 11/1999 | Tan et al. | 361/56 |
| 5,998,832 A | * | 12/1999 | Sheu et al. | 257/327 |
| 6,002,155 A | * | 12/1999 | Tahara et al. | 257/355 |
| 6,008,508 A | * | 12/1999 | Bergemont et al. | 257/175 |

FOREIGN PATENT DOCUMENTS

| | | | | |
|---|---|---|---|---|
| JP | 404010473 | * | 1/1992 | 257/355 |
| JP | 404105362 | * | 4/1992 | 257/355 |
| JP | 404111358 | * | 4/1992 | 257/355 |
| JP | 404111359 | * | 4/1992 | 257/355 |
| JP | 405121679 | * | 5/1993 | 257/355 |
| JP | 405136328 | * | 6/1993 | 257/355 |
| WO | 093008602 | * | 4/1993 | 257/355 |

* cited by examiner

*Primary Examiner*—Jerome Jackson, Jr.
*Assistant Examiner*—Edgardo Ortiz
(74) *Attorney, Agent, or Firm*—Marger Johnson & McCollom, P.C.

(57) ABSTRACT

An electrostatic discharge (ESD) protection transistor for discharging current from an ESD event present on an input/output pad. The ESD protection transistor is capable of improved discharging of excessive current without damage to the semiconductor device and to the ESD protection transistor itself. The ESD protection transistor includes a first conductive line connecting an input/output pad to the source and drain of the transistor at multiple points preventing the convergence of an excessive current at a certain point and ESD damage to the transistor. The transistor also includes a second conductive line formed on an insulating layer such that it does not overlap with the first conductive line.

12 Claims, 3 Drawing Sheets

ELECTROSTATIC DISCHARGE PROTECTION TRANSISTOR FOR A SEMICONDUCTOR CHIP

BACKGROUND OF THE INVENTION

1. Field of the Invention

The present invention relates to an electrostatic discharge (ESD) protection transistor for a semiconductor chip and, more particularly, to an ESD protection transistor for a semiconductor chip that is tolerant of electrostatic discharges.

2. Discussion of Related Art

With the advent of the deep submicron era, semiconductor devices need to be scaled down and have a shallow junction structure. Accordingly, designers of such devices are more than ever concerned with the problem of electrostatic discharge when creating device specifications. This concern reflects that a chip must pass an ESD test range set by a user even though the device is an otherwise good chip. Therefore, recent development of semiconductor chips, has focused on making chips that have a high tolerance for ESD. For this reason, as illustrated in FIG. 1, an additional ESD protection transistor 200 is mounted on an input/output pad 100 in order to protect an internal circuit 300 from the static electricity accumulated on the pad 100.

As illustrated in FIG. 2, a conventional ESD protection transistor has a plurality of active junctions 202 formed on the semiconductor substrate (not shown). A plurality of gate electrodes 204 is arranged in parallel in the horizontal direction along the active junctions 202 on the substrate. A source (not shown) is formed in the active junction 202 on one side of the gate electrode 204. A drain (not shown) is formed in the active junction 202 on the other side of the gate electrode 204. A first conductive line 206 having a predetermined pattern is formed on the substrate. The first conductive line 206 covers the gate electrode 204 thereby integrally connecting the gate electrode 204 with the input/output pad 100 forming a first insulating layer (not shown). The first conductive line 206 is also integrally connected with the active junction along the upper part of the adjacent active junction and the drain (not shown) to thereby have a predetermined overlapping portion. A second conductive line 208 having a predetermined pattern is integrally connected with the active junction 202 along its external line and a predetermined upper portion of the source. A third conductive line 210 is formed on the first insulating layer having the first and second conductive lines 206 and 208, having the second insulating layer (not shown) therebetween, so that the source and gate electrode 204 are coupled to ground and the drain and the first conductive line 206 are commonly connected to the input/output pad 100.

The first conductive line 206 and the drain are electrically connected with each other through the first conductive plug. The first conductive plug fills in contact hole h1 of the first insulating layer. The second and third conductive lines 208 and 210 are electrically connected with each other through a second conductive plug, for example, a Tungsten (W) plug. The second conductive plug fills in contact hole h2 of the second insulating layer.

The reason for the ESD protection transistor is to protect the devices of the internal circuit from being damaged due to a sudden over-voltage supplied to the internal circuit 300 due to the static electricity accumulated in the input/output pad 100.

However, when applying the prior art ESD protection transistor 200 to the manufacture of semiconductor devices, many malfunctions caused by ESD still result. The malfunctions can be classified into two types. The first malfunction type is generated by the opening of a predetermined portion in the first conductive line 206. The second malfunction type is caused by a power leakage to the substrate because of the junction broken down by the contact spike as illustrated in FIG. 3b. The former is generated during ESD test because a high voltage is suddenly applied to the input/output pad 100 and a large amount of current flows instantaneously through the first conductive line 206 integrally connected to the pad 100, so that the conductive line 206, which is not tolerant of the high voltage, melts and breaks. The first malfunction type is illustrated as region I of FIG. 3a. To simplify the explanation, only the input/output pad 100 and the first and second conductive lines 206 and 208 are illustrated in FIG. 3a. The second malfunction type is generated during ESD test because a large amount of current is converged to the first contact and the last contact which are affected from the pad 100 and therefore the contacts, which are not tolerant of the high current, break down. The second malfunction type is illustrated as region II of FIG. 3b. In this case, only the input/output pad 100 and the first and second conductive lines 206 and 208 are shown.

The ESD malfunction types are generated because the ESD protection transistor 200 does not operate properly when a voltage is applied to all pins instantaneously. Therefore, a need exists for an ESD protection transistor that prevents semiconductor device breakdown and increases its yield.

SUMMARY OF THE INVENTION

Accordingly, the present invention is directed to an ESD protection transistor for a semiconductor chip that overcomes the problems associated with prior art ESD protection transistors.

An object of the present invention is to provide an electrostatic discharge protection transistor for a semiconductor chip by structuring the ESD protection transistor to employ a plurality of a first conductive lines directly connected with the input/output pad. By doing so, the pad and the first conductive line are integrally connected with each other at multiple points thereby preventing a malfunction due to ESD.

To achieve these and other advantages, an electrostatic discharge protection transistor for a semiconductor integrated circuit is provided. The electrostatic discharge protection transistor includes a plurality of gate electrodes formed on a semiconductor substrate having a plurality of active junctions, the plurality of gate electrodes being arranged in parallel along the active junctions. A drain region is formed on a first active junction on one side of a first gate electrode. A source region is formed in a second active junction on the other side of the first gate electrode. A first insulating layer is formed on the substrate, the first insulating layer having a plurality of contact holes that expose predetermined portions of the surface of the drain region. A first conductive line is formed on a first predetermined portion of the first insulating layer and connected to the first plurality of conductive plugs, the first conductive line being integrally connected with an input/output pad at multiple points. Finally, a second conductive line is formed on a second predetermined portion of the first insulating layer such that the first and second conductive lines do not overlap.

BRIEF DESCRIPTION OF THE ATTACHED DRAWINGS

The foregoing and other objects, features, and advantages of the invention will become more readily apparent from the following detailed description of a preferred embodiment that proceeds with reference to the following drawings.

FIG. 1 a schematic view of the structure of an input/output cell for a semiconductor chip having a conventional ESD protection transistor;

DETAILED DESCRIPTION OF PREFERRED EMBODIMENT

Reference will now be made in detail to the preferred embodiments of the present invention, examples of which are illustrated in the accompanying drawings.

Figure 1:
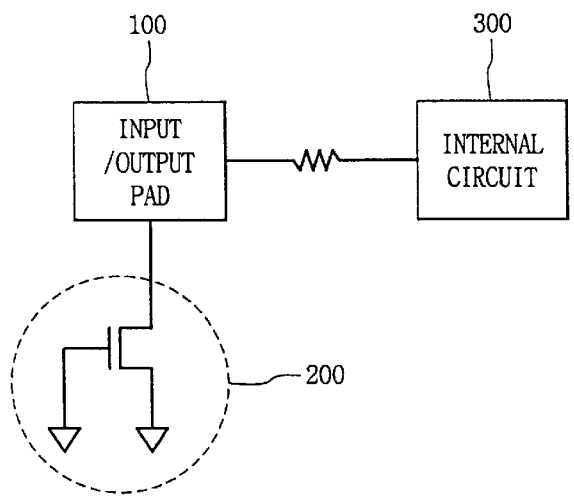
Figure 2:
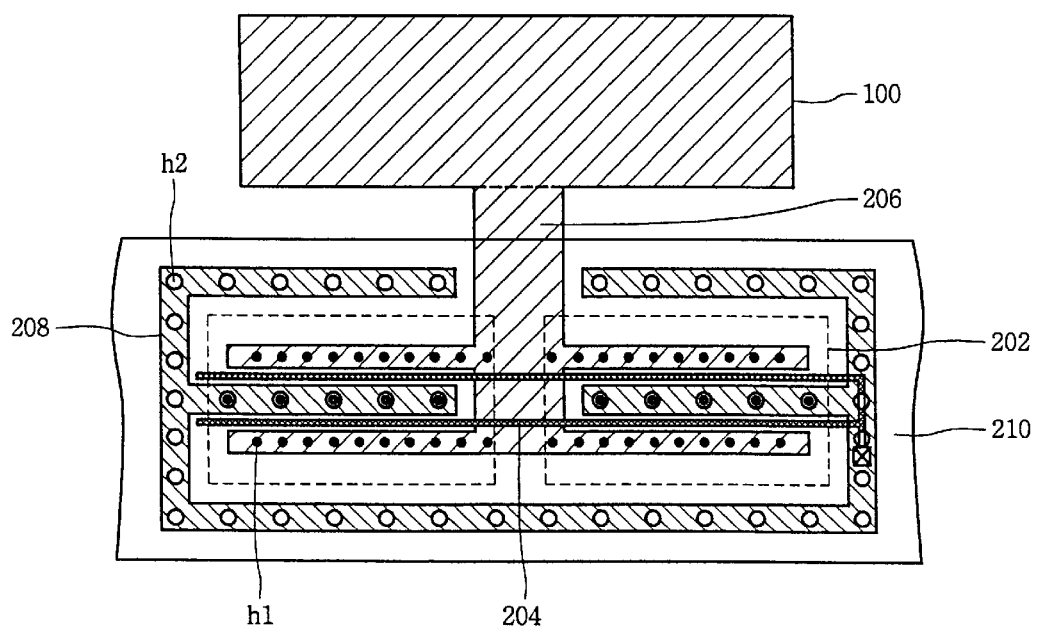
FIG. 2 is a plan view of the layout of the conventional ESD protection transistor shown in FIG. 1.
Figure 3A:
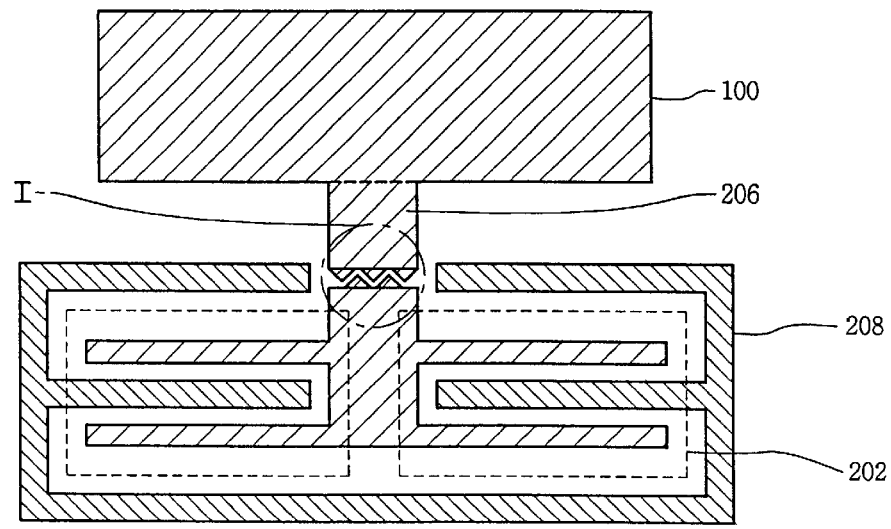
FIG. 3a is a plan view of a first type of ESD malfunction where an open is generated in a conductive line.
Figure 3B:
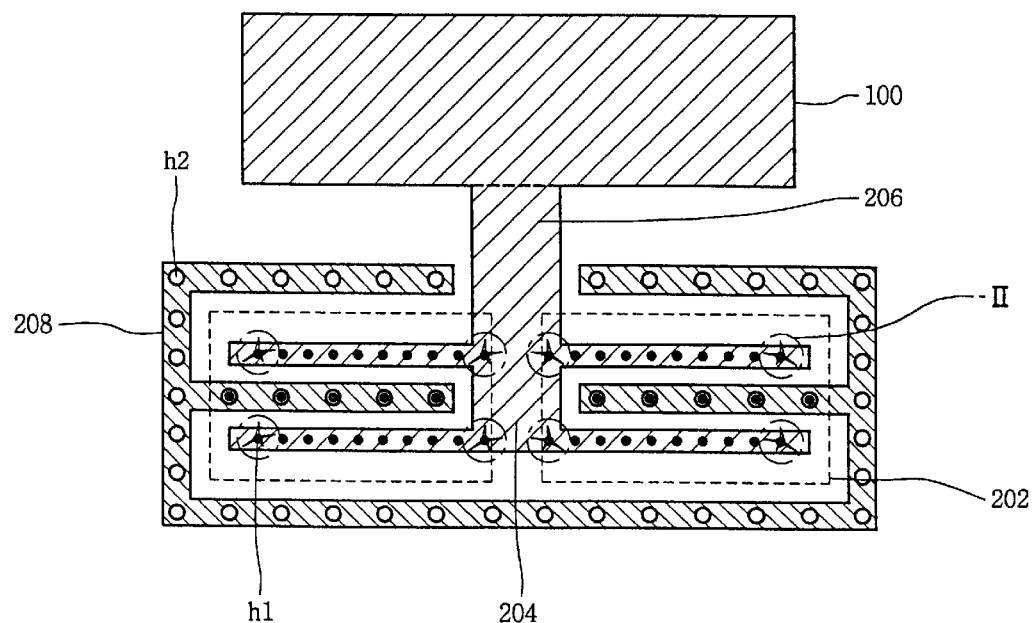
FIG. 3b is a plan view of a second type of ESD malfunction where a contact spike breaks down a junction.

The ESD transistor of the present invention prevents a large amount of current from converging on a point, for example, region I of FIG. 3a or region II of FIG. 3b, even through a high voltage is instantaneously applied to the substrate. The ESD transistor of the present invention includes a first conductive line 206 integrally connected to an input/output pad 100 at multiple points.

Figure 4:
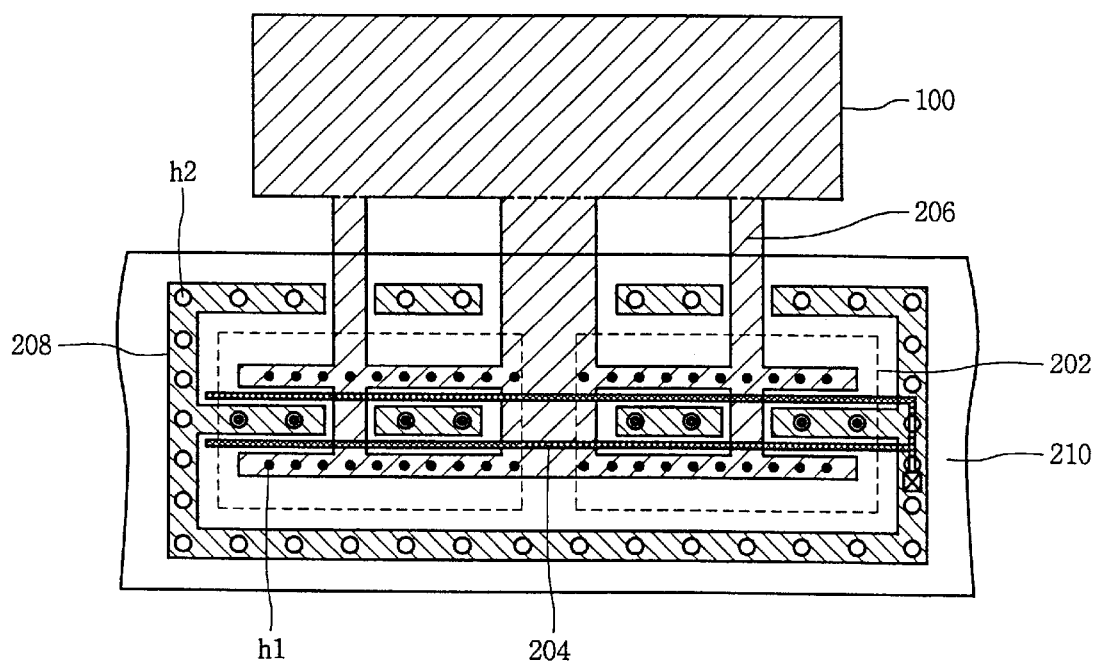
FIG. 4 is a plan view of the layout of an ESD protection transistor according to the invention.

Referring to FIG. 4, the ESD protection transistor of the invention includes a plurality of active junctions 202 formed on semiconductor substrate (not shown). A plurality of gate electrodes 204 is formed in parallel in a horizontal direction along the active junctions 202. A source region (not shown) is formed in the active junction 204 on the one side of the gate electrodes 204. A drain region (not shown) is formed in the active junction 204 on the other side of the gate electrodes 204. A first insulating layer is formed on the drain region. The first insulating layer has a plurality of contact holes h1 exposing a predetermined part of the drain region. A first conductive plug (not shown) is formed in the contact hole h1 and consists of tungsten (W), an aluminum (Al) alloy, or a copper (Cu) alloy. A first conductive line 206 is coupled with the first conductive plug at a first predetermined portion of the first insulating layer. For example, the first predetermined portion of the first insulating layer can be the upper part of the adjacent active junctions, the upper part of the active junction on the predetermined portion which is kept at a distance right and left from the adjacent part of the active junction and the upper part of the drain region. The first conductive line 206 is connected to the input/output pad 100 at multiple points, e.g., three points. A second conductive line 208 is formed on a second predetermined portion of the first insulating layer. For example, the second predetermined portion of the first insulating layer can be the external edge of the active junction 202 and the predetermined upper part of the source region. The second conductive line 208 does not overlap with the first conductive line 206. A second insulating layer (not shown) is formed on the first insulating layer having the first and second conductive lines 206 and 208 and having a plurality of via holes h2 to thereby expose a predetermined portion of the surface of the second conductive line 208. A second conductive plug (not shown) is formed in the via holes h2. Finally, a third conductive line 210 is formed on the second insulating layer having the first and second conductive lines 206 and 208 being connected to the second conductive plug, the source region and the gate electrode 204 being coupled to ground, and the drain region being commonly connected with the first conductive line 206 through the input/output pad 100.

FIG. 4 illustrates that the first conductive line 206 and the input/output pad 100 are connected with each other at three points. The number of the multiple connection points is, however, variable. The whole layout of the ESD protection transistor can be structured as such to connect the pad 100 and the first conductive line through two, four, or any number of points.

Here, the first conductive line 206 is integrally connected to the input/output pad 100 at multiple points with the drain region in the active junction 202 at an angle of 90°.

If the layout of the ESD protection transistor is designed as above, during the ESD test, even though a large amount of current flows through the first conductive line 206 by applying a sudden high voltage to the pad 100, as the first multiple conductive lines are connected to the pad 100, the current converging on the region I of FIG. 3a can be dispersed, so that the opening at the point I is prevented. In addition, the invention can eliminate the problem of a contact spike generated in the first and last contacts that are affected by the overcurrent from the pad 100, thereby preventing the decrease of the functional characteristic of the semiconductor device caused by the power leakage.

Accordingly, in contrast to the conventional art, the ESD protection transistor of the present invention has a high tolerance for ESD preventing breakdown of the internal circuit 300 due to the instantaneous overvoltage applied caused by the static electricity that accumulates in the input/output pad 100.

As described above, with the ESD protection transistor of the present invention, the first conductive line and the input/output pad are integrally connected with each other at multiple points, so that even though a high voltage is instantaneously applied to the pins, the overcurrent cannot converge on a certain point. Therefore, the malfunction of the device due to an ESD event, such as the opening in the first conductive line or the contact spike, is prevented.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. An electrostatic discharge protection transistor for a semiconductor integrated circuit, comprising:

one or more gate electrodes formed on a semiconductor substrate having corresponding one or more active junctions, the gate electrodes being arranged in parallel along the active junctions;

a drain region formed on a first active junction on one side of a first gate electrode;

a source region formed in a second active junction on the other side of the first gate electrode;

an insulating layer formed on the substrate, the insulating layer having a plurality of contact holes that expose predetermined portions of the drain region;

a first conductive line formed on the insulating layer and connected to the plurality of contact holes, the first conductive line having multiple sections for dispersing current from an input/output pad, each section being integrally connected with the input/output pad and the drain at multiple points; and a second conductive line formed on the insulating layer such that the first and second conductive lines do not overlap.

2. The electrostatic discharge protection transistor according to claim 1 wherein the first conductive line is connected with the drain region at an angle of 90°.

3. An electrostatic discharge protection transistor for a semiconductor integrated circuit, comprising:
   one or more gate electrodes formed on a semiconductor substrate having corresponding one or more active junctions, the gate electrodes being arranged in parallel along the active junctions;
   a drain region formed on a first active junction on one side of a first gate electrode;
   a source region formed in a second active junction on the other side of the first gate electrode;
   an insulating layer formed on the substrate, the insulating layer having a plurality of contact holes that expose predetermined portions of the drain region;
   a first conductive line formed on the insulating layer and connected to the plurality of contact holes, the first conductive line having multiple sections for dispersing current from an input/output pad, each section being integrally connected with the input/output pad and the drain at multiple points; and
   a second conductive line formed on the insulating layer such that the first and second conductive lines do not overlap;
   wherein the first and second conductive lines and the input/output pad consist of "Al" alloy or "Cu" alloy.

4. The electrostatic discharge protection transistor according to claim 1 wherein the one or more gate electrodes and the source region are connected to ground.

5. The electrostatic discharge protection transistor of a semiconductor chip as claimed in claim 1, wherein the gate electrodes and the source region are coupled to the ground.

6. The electrostatic discharge protection transistor of a semiconductor chip as claimed in claim 1, wherein the first conductive line is formed on the first insulating layer to be integrally connected with the adjacent upper part of the adjacent active junctions, the upper part of the active junction on a predetermined point which is kept at a distance right and left from the adjacent part of the active junction, and the upper part of the drain region.

7. An electrostatic discharge protection transistor for a semiconductor integrated circuit, comprising:
   one or more gate electrodes formed on a semiconductor substrate having corresponding one or more active junctions, the gate electrodes being arranged in parallel along the active junctions;
   a drain region formed on a first active junction on one side of a first gate electrode;
   a source region formed in a second active junction on the other side of the first gate electrode;
   an insulating layer formed on the substrate, the insulating layer having a plurality of contact holes that expose predetermined portions of the drain region;
   a first conductive line formed on the insulating layer and connected to the plurality of contact holes, the first conductive line having multiple sections for dispersing current from an input/output pad, each section being integrally connected with the input/output pad and the drain at multiple points; and
   a second conductive line formed on the insulating layer such that the first and second conductive lines do not overlap;
   wherein the second conductive line is formed on the first insulating layer along the external edge of the active junction and the upper part of the source region.

8. An electrostatic discharge protection transistor integrated circuit, comprising:
   one or more gate electrodes formed on a semiconductor substrate having corresponding one or more active junctions, the gate electrodes being arranged in parallel along the active junctions;
   a drain region formed on a first active junction on one side of a first gate electrode;
   a source region formed in a second active junction on the other side of the first gate electrode;
   an insulating layer formed on the substrate, the insulating layer having a plurality of contact holes that expose predetermined portions of the drain region;
   a first conductive line formed on the insulating layer and connected to the plurality of contact holes, the first conductive line having multiple sections for dispersing current from an input/output pad, each section being integrally connected with the input/output pad and the drain at multiple points; and
   a second conductive line formed on the insulating layer such that the first and second conductive lines do not overlap;
   wherein the second conductive line is commonly connected to the one or more gates and the source region.

9. An electrostatic discharge protection circuit for a semiconductor integrated device, comprising:
   a pad;
   a transistor including source and drain regions and a gate electrode;
   a plurality of first conductive lines, each first conductive line being connected to the pad and the drain region at multiple points through a plurality of contact holes such that current from the pad disperses through the plurality of first conductive lines to the plurality of contact holes; and
   a second conductive line connected to the source region and the gate electrode, the second conductive line being formed to not overlap the plurality of first conductive lines.

10. The electrostatic discharge protection circuit of claim 9 wherein the gate electrode and the source region are connected to ground.

11. The electrostatic discharge protection circuit of claim 9 wherein the plurality of first conductive lines are connected to the pad and the drain region at a 90 degree angle.

12. An electrostatic discharge protection transistor for a semiconductor integrated circuit, comprising:
   one or more gate electrodes formed on a semiconductor substrate having corresponding one or more active junctions;
   a drain region formed on a first active junction on one side of a first gate electrode;
   a source region formed in a second active junction on the other side of the first gate electrode;
   an insulating layer formed on the substrate, the insulating layer having a plurality of contact holes that expose predetermined portions of the drain region; and
   a plurality of conductive lines formed on the insulating layer and connected between a plurality of points on an input/output pad and a plurality of contact holes, the plurality of conductive lines having multiple sections for dispersing current from the input/output pad.

* * * * *

UNITED STATES PATENT AND TRADEMARK OFFICE
CERTIFICATE OF CORRECTION

PATENT NO.    : 6,359,313 B1
DATED         : March 19, 2002
INVENTOR(S)   : Yang et al.

It is certified that error appears in the above-identified patent and that said Letters Patent is hereby corrected as shown below:

Title page,
Item [73], "Samsung electronics" should read -- Samsung Electronics --.

Column 3,
Line 15, "EMB0DIMENT" should read -- EMBODIMENT --.
Line 23, "through" should read -- though --.
Lines 32 and 34, "junction 204" should read -- junction 202 --.
Line 35, "layer is" should read -- layer (not shown) is --.

Signed and Sealed this

Third Day of December, 2002

JAMES E. ROGAN
*Director of the United States Patent and Trademark Office*